United States Patent [19]

Lee

[11] Patent Number: 5,237,198
[45] Date of Patent: Aug. 17, 1993

[54] LATERAL PNP TRANSISTOR USING A LATCH VOLTAGE OF NPN TRANSISTOR

[75] Inventor: Ho-Jin Lee, Inchun, Rep. of Korea

[73] Assignee: Samsung Electronics Co., Ltd., Suweon, Rep. of Korea

[21] Appl. No.: 860,271

[22] Filed: Apr. 1, 1992

Related U.S. Application Data

[63] Continuation of Ser. No. 626,719, Dec. 17, 1990, abandoned.

[30] Foreign Application Priority Data

Dec. 16, 1989 [KR] Rep. of Korea .................. 89/18743

[51] Int. Cl.⁵ .......................................... H01L 29/72
[52] U.S. Cl. ..................................... 257/557; 257/575; 257/577
[58] Field of Search .................. 357/35, 557, 577, 575

[56] References Cited

U.S. PATENT DOCUMENTS

| | | | |
|---|---|---|---|
| 4,489,341 | 12/1984 | Mayrand | 357/35 |
| 4,542,399 | 9/1985 | Monticelli | 357/35 |
| 4,558,286 | 12/1985 | Neidorff | 357/35 |
| 4,886,982 | 12/1989 | Villa et al. | 357/35 |
| 4,901,132 | 2/1990 | Kuwano | 357/35 |
| 4,935,375 | 6/1990 | Kasper et al. | 357/35 |
| 4,979,008 | 12/1990 | Siligoni et al. | 357/35 |

FOREIGN PATENT DOCUMENTS

| | | | |
|---|---|---|---|
| 3010035 | 10/1981 | Fed. Rep. of Germany | 357/35 |
| 56-126958 | 10/1981 | Japan | 357/35 |
| 59-152666 | 8/1984 | Japan | 357/35 |
| 61-16569 | 1/1986 | Japan | 357/35 |
| 63-248166 | 10/1988 | Japan | 357/35 |
| 0181353 | 3/1989 | Japan | 357/35 |
| 1122160 | 5/1989 | Japan | 357/35 |
| 1256165 | 10/1989 | Japan | 357/35 |

OTHER PUBLICATIONS

IBM Technical Disclosure Bulletin, vol. 27, #11, pp. 6490–6491 Apr. 1985.

*Primary Examiner*—Mark V. Prenty
*Attorney, Agent, or Firm*—Cushman, Darby & Cushman

[57] ABSTRACT

A lateral PNP transistor having either of the collector or the emitter diffusion layers layered with an n⁺ type diffusion layer, is shown. The added layer serves to increase the static electricity withstand stress along a transistor discharging path. A low withstand stress contributes to transistor damage at high breakdown voltages. When an n⁺ diffusion layer is formed within a diffusion layer in a lateral PNP transistor the transistor behaves as a combination of two transistors, PNP and NPN, selectively configured.

2 Claims, 3 Drawing Sheets

LATERAL PNP TRANSISTOR USING A LATCH VOLTAGE OF NPN TRANSISTOR

This is a continuation of application No. 07/626,719, filed on Dec. 17, 1990, which was abandoned upon the filing hereof.

BACKGROUND OF THE INVENTION

Field of the Invention

The present invention relates to a lateral PNP transistor having a characteristic latch voltage that of an NPN transistor. More particularly, the invention is directed to a transistor in which an n+ diffusion layer is formed within an emitter diffusion layer (or a collector diffusion layer) to improve the electrostatic withstand-stress of the transistor by discharging a static electricity when the static electricity is applied to a base of the lateral PNP transistor.

Description of the Related Art

In a conventional lateral PNP transistor, as shown in FIG. 1, n+ type buried layer 11 and n− type epitaxial layer 12 are deposited on a p− type substrate. A P type diffusion layer 13 for an emitter, a P type diffusion layer 14 for a collector and n+ type diffusion layer 15 for a base are formed on the n− type epitaxial layer 12. Electrodes 13', 14', 15' are then formed onto the diffusions through each contact hole. In FIG. 1 reference numeral 16 shows an element isolation layer.

In such a transistor construction, when static electricity is applied to the base of the lateral PNP transistor, the discharging path of the static electricity is along a path between the base 15 and the collector 14 or between the base 15 and the emitter 13. It is a well-known fact that a higher breakdown voltage in the discharging path results in the transistor being easily destroyed by a lower voltage of static electricity.

Hence, if the breakdown voltage $BV_{CBO}$ between the base 15 and collector 14 and the breakdown voltage $BV_{EBO}$ between the base 15 and emitter 13 occurs at a high voltage, the transistor may be destroyed by a low voltage of static electricity.

SUMMARY OF THE INVENTION

It is accordingly the object of the present invention to provide a lateral PNP transistor which can improve the static electricity withstand-stress by displacing the breakdown voltage $BV_{CBO}$ between a base and collector and the breakdown voltage $BV_{EBO}$ between a base and emitter of the lateral PNP transistor with a voltage characteristic of a latch voltage between a collector and an emitter of a conventional NPN transistor.

According to the principle of the present invention, the static electricity withstand-stress is increased by lowering the breakdown voltage along the discharging path. More particularly, the breakdown voltages $BV_{CBO}$ and $BV_{EBO}$ of the lateral PNP transistor are displaced by a characteristic latch voltage $LV_{CEO}$ thereby improving the static electricity withstand-stress. This is achieved by forming a different n+ type diffusion layer within the diffusion layer corresponding to either the emitter or the collector region of the PNP transistor.

BRIEF DESCRIPTION OF THE DRAWINGS

The accompanying drawings, which are incorporated in and constitute a part of the specification, illustrate presently preferred embodiments of the invention.

DETAILED DESCRIPTION OF THE PREFERRED EMBODIMENTS

The present invention will be described in detail with reference to the accompanying drawings.

Figure 1:
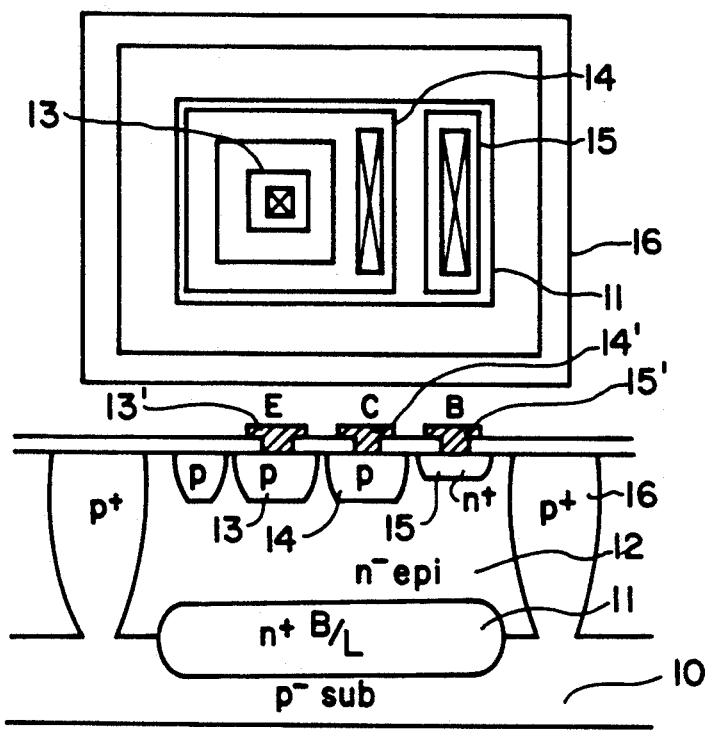
FIG. 1 is a diagrammatic view showing a lateral and perpendicular construction of a conventional lateral PNP transistor.
Figure 2:
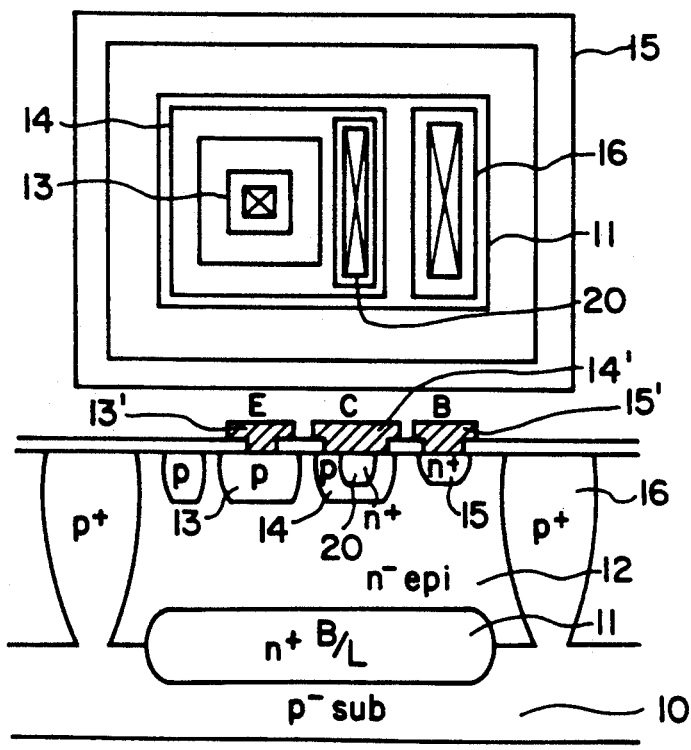
FIG. 2 is a diagrammatic view showing a lateral and perpendicular construction of a lateral PNP transistor according to the present invention.

FIG. 2 shows a transistor configuration of a first embodiment of an n+ diffusion layer formed in the collector region a lateral PNP transistor. In FIG. 2, the n+ buried layer 11 and the n− epitaxial layer 12 are sequentially deposited on the p− substrate 10. Subsequently, a p type diffusion layer 13 constituting an emitter, a p type diffusion layer 14 constituting a collector and a n+ diffusion layer 15 for a base are formed within the n− type epitaxial layer 12, respectively. The n+ type diffusion layer 20 is formed within the P type collector diffusion layer 14 and connected to a collector electrode 14'. In FIG. 2, the lower side drawing shows a vertical structural view of the lateral PNP transistor and an upper side drawing shows the horizontal structural view of the lateral PNP transistor.

Figure 3:
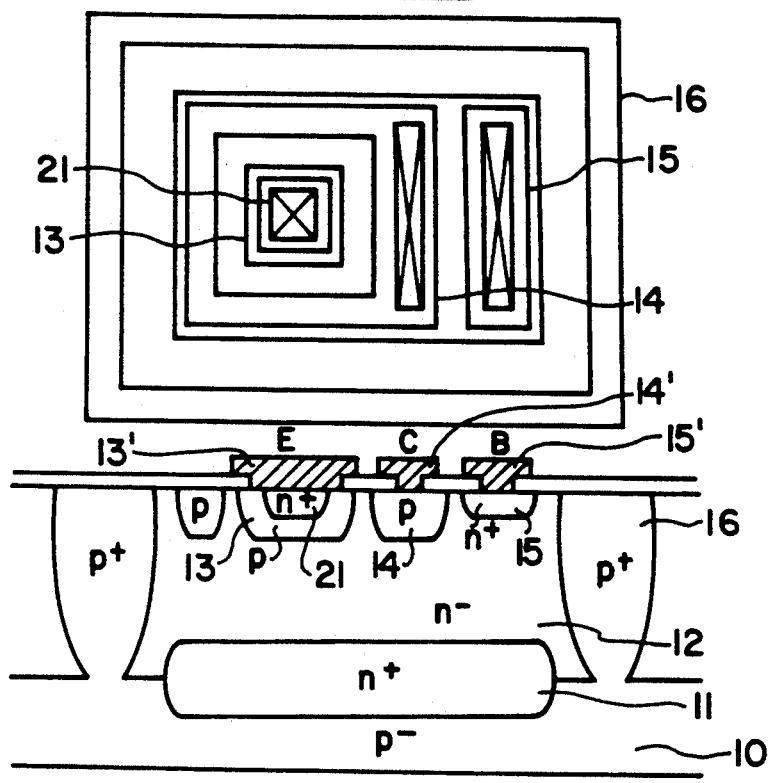
FIG. 3 is a diagrammatic view showing a modified lateral and perpendicular construction of the lateral PNP transistor according to the present invention.

FIG. 3 shows a transistor configuration of a second embodiment. An n+ type diffusion layer is formed within an emitter region of a lateral PNP transistor. A P− type substrate layer 10, a n+ type buried layer 11 and a n− type epitaxial layer 12 are sequentially deposited. A P type diffusion layer 13 constituting an emitter, a P type diffusion layer 14 constituting a collector and an n+ type diffusion layer 15 constituting a base are formed in the n− type epitaxial layer 12. Subsequently, an n+ type diffusion layer 21 is formed within the P type emitter diffusion layer 13 and connected to an emitter electrode 13'.

Figure 4A:
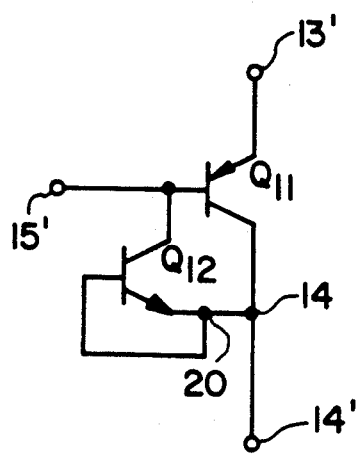
FIG. 4(a) is an equivalent circuit diagram of FIG. 2.

FIG. 4(a) is an equivalent circuit diagram of the properties of FIG. 2. In this drawing, the base and collector of the transistor Q11 are connected to the collector and emitter of transistor Q12, respectively. The base and collector of the transistor Q12 are directly connected to one another. PNP transistor Q11 characteristically comprises diffusion layers 13, 14 and 15 and is shown connected to NPN transistor Q12. Together with the n+ type diffusion layer 20 formed in the collector diffusion layer 14 the lateral PNP transistor of FIG. 2 exhibits properties characteristic of the PNP/NPN configuration of FIG. 4(a).

Figure 4B:
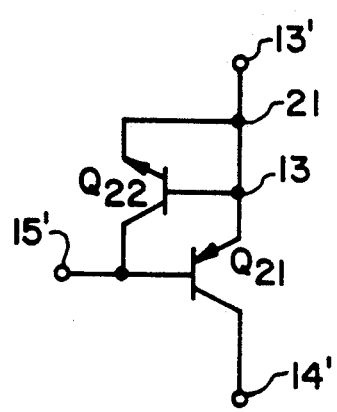
FIG. 4(b) is an equivalent circuit diagram of FIG. 3.

Similarly, FIG. 4(b) is an equivalent circuit diagram of the properties of FIG. 3. The base and emitter of the transistor Q21 are connected to the collector and emitter of the transistor Q22, respectively. The base and emitter of the transistor Q22 are directly connected to one another. PNP transistor Q21 characteristically comprises diffusion layers 13, 14 and 15 and is shown connected to PNP transistor Q22. Together with the N+ type diffusion layer 21 formed in the emitter diffusion layer 13 the lateral PNP transistor of FIG. 3 exhibits properties characteristic of the PNP/PNP configuration of FIG. 4(b).

Figure 5:
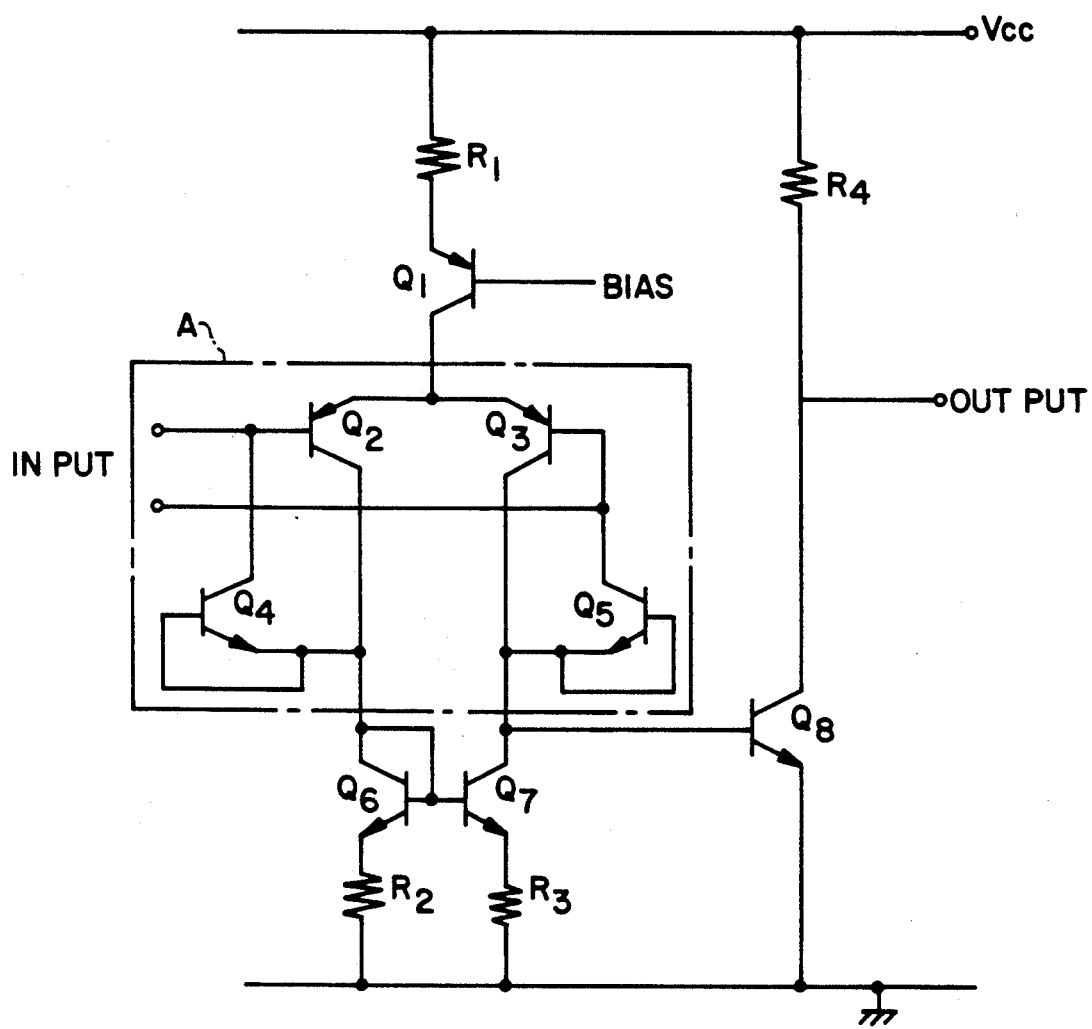
FIG. 5 is a diagram explaining an example of a circuit construction with the equivalent circuit of FIG. 4(a) being applied to an input terminal of a conventional OP amplifier.

Also, FIG. 5 shows a differential amplifier having a lateral PNP transistor A of FIG. 2, wherein A is represented by its equivalent circuit diagram as shown by FIG. 4(a). FIG. 5 is a circuit utilizing a lateral PNP construction according to the present invention the output fed to the input side of an OP amplifier.

In the differential amplifier of FIG. 5, transistors Q2 and Q3 are used as basic transistors of a conventional differential amplifier. However, the emitter and collector of transistors Q4 and Q5 are shown connected to the collector and base of transistors Q2 and Q3. The base and the emitter of transistors Q4 and Q5 are directly connected as shown. The collectors of transistors Q2 and Q3 are connected to the collector of transistor Q6 and Q7, respectively. Resistors R2 and R3 are connected to the emitter of Q6 and Q7, respectively. The bases of transistors Q6 and Q7 are connected in common. The output of the transistor Q3 is supplied to the base of transistor Q8. The output of transistor Q8 is then applied to the input of OP amplifier (not shown).

In the configuration of FIG. 5, the differential amplifier is comprised of combination transistors Q2 and Q4 and combination transistors Q3 and Q5, each combination being an equivalent circuit representation of a lateral PNP transistor according to FIG. 2.

The operation of FIG. 5 will now be described in accordance with a differential amplifier comprising two lateral PNP transistors represented by Q2, Q4 and Q3, Q5, respectively. Transistor Q1 receives a base bias voltage and an emitter power voltage VCC through the resistor R1. Transistor Q1 then supplies current to the differential amplifier A. Resistor R4 acts as the load element of the input to an OP amplifier. When positive static electricity is applied to a collector 14 and base 15 of a lateral PNP transistor, Q2/Q4 or Q3/Q5, a discharging path is formed equivalent to the latch voltage $LV_{CBO}$ of the equivalent circuit representation in the NPN transistor Q4 or Q5. In a conventional differential amplifier the breakdown voltage $BV_{CBO}$ of the lateral PNP transistor would be higher than the latch voltage $LV_{CEO}$ of the NPN transistor equivalent circuit representation of the present invention. Accordingly, the lateral PNP transistor of the present invention provides a high static electricity withstand stress due to latch voltage $LV_{CEO}$.

In summary, the present invention provides a new lateral PNP transistor having an increased static electricity withstand-stress.

The present invention describes a new lateral PNP transistor having an n+ type diffusion layer that obviates the need of using a second NPN transistor to increase the static electricity withstand-stress of transistors, thereby reducing circuit components and increasing circuit efficiency.

What is claimed is:

1. A lateral PNP transistor comprising:
    (a) a p-type substrate;
    (b) a high impurity concentration n layer overlying said p-type substrate;
    (c) a low impurity concentration n layer defining a base region therein overlying said p-type substrate and said first high impurity concentration n layer;
    (d) a p-type collector diffusion region, a p-type emitter diffusion region and an n-type base contact diffusion region formed in said low impurity concentration n layer, said collector, emitter and base contact diffusion regions being adjacent to each other but spaced apart within the low impurity concentration n layer; and
    (e) a high impurity concentration n-type diffusion region formed entirely within the collector diffusion region wherein the formation of the high impurity concentration n-type diffusion region increases the withstand stress of the PNP transistor and thereby prevents transistor failure in response to a high breakdown voltage.

2. A lateral PNP transistor comprising:
    (a) a p-type substrate;
    (b) a high impurity concentration n layer overlying said p-type substrate;
    (c) a low impurity concentration n layer defining a base region therein overlying said p-type substrate and said first high impurity concentration n layer;
    (d) a p-type collector diffusion region, a p-type emitter diffusion region and an n-type base contact diffusion region formed in said low impurity concentration n layer, said emitter and base contact diffusion regions being disposed on opposite sides of said collector diffusion region and entirely within said low impurity concentration n layer; and
    (e) a high impurity concentration n-type diffusion region formed entirely within the collector diffusion region wherein the formation of the high impurity concentration n-type diffusion region increases the withstand stress of the PNP transistor and thereby prevents transistor failure in response to a high breakdown voltage.

* * * * *